(12) United States Patent
Chung et al.

(10) Patent No.: US 9,679,934 B2
(45) Date of Patent: Jun. 13, 2017

(54) SEMICONDUCTOR DEVICE

(71) Applicant: Powerchip Technology Corporation, Hsinchu (TW)

(72) Inventors: Tse-Wei Chung, Taichung (TW); Tsung-Hui Chou, New Taipei (TW); Hsu-Ting Chang, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/385,836

(22) Filed: Dec. 20, 2016

(65) Prior Publication Data

US 2017/0098677 A1 Apr. 6, 2017

Related U.S. Application Data

(62) Division of application No. 14/864,912, filed on Sep. 25, 2015, now Pat. No. 9,613,995.

(30) Foreign Application Priority Data

Jul. 6, 2015 (TW) .............................. 104121918 A

(51) Int. Cl.
*H01L 21/00* (2006.01)
*H01L 27/146* (2006.01)

(52) U.S. Cl.
CPC .... *H01L 27/14625* (2013.01); *H01L 27/1462* (2013.01); *H01L 27/14623* (2013.01); *H01L 27/14636* (2013.01); *H01L 27/14643* (2013.01); *H01L 27/14685* (2013.01)

(58) Field of Classification Search
CPC ......... H01L 27/14625; H01L 27/14623; H01L 27/14643
See application file for complete search history.

(56) References Cited

U.S. PATENT DOCUMENTS

| | | | | |
|---|---|---|---|---|
| 8,274,101 B2* | 9/2012 | Venezia | ............ | H01L 27/14603 257/225 |
| 8,921,901 B1* | 12/2014 | Kao | .................. | H01L 27/14687 257/226 |
| 9,356,061 B2* | 5/2016 | Fan | .................... | H01L 27/14623 |
| 2005/0269656 A1* | 12/2005 | Shian-Ching | ..... | H01L 27/14621 257/440 |

(Continued)

FOREIGN PATENT DOCUMENTS

JP WO 2015119186 A1 * 8/2015 ....... H01L 27/14621

*Primary Examiner* — Laura Menz
(74) *Attorney, Agent, or Firm* — Jianq Chyun IP Office

(57) ABSTRACT

A semiconductor device including a substrate, at least one sensor, a dielectric layer, at least one light pipe structure, at least one pad, a shielding layer, and a protection layer is provided. The sensor is located in the substrate of a first region. The dielectric layer is located on the substrate. The light pipe structure is located in the dielectric layer of the first region. The light pipe structure corresponds to the sensor. The pad is located in the dielectric layer of a second region. The shielding layer is located on the dielectric layer, wherein the light pipe structure is surrounded by the shielding layer. The protection layer is located on the shielding layer. At least one pad opening is disposed in the dielectric layer, the shielding layer, and the protection layer above the pad. The pad opening exposes a top surface of the corresponding pad.

11 Claims, 4 Drawing Sheets

(56) References Cited

U.S. PATENT DOCUMENTS

| | | | |
|---|---|---|---|
| 2006/0076590 A1* | 4/2006 | Pain | H01L 27/14601 257/294 |
| 2006/0084194 A1* | 4/2006 | Huang | H01L 27/14621 438/48 |
| 2009/0224349 A1* | 9/2009 | Gambino | H01L 27/14603 257/432 |
| 2010/0163714 A1* | 7/2010 | Wober | G02B 6/4204 250/227.2 |
| 2010/0176506 A1* | 7/2010 | Hsu | H01L 23/481 257/698 |
| 2015/0035028 A1* | 2/2015 | Fan | H01L 27/14623 257/292 |
| 2016/0118433 A1* | 4/2016 | Chung | H01L 27/14689 438/69 |
| 2016/0351610 A1* | 12/2016 | Chen | H01L 27/14627 |
| 2017/0012070 A1* | 1/2017 | Chung | H01L 27/14623 |
| 2017/0018595 A1* | 1/2017 | Kao | H01L 27/14623 |

* cited by examiner

SEMICONDUCTOR DEVICE

CROSS-REFERENCE TO RELATED APPLICATION

This application is a divisional application of and claims the priority benefit of a prior application Ser. No. 14/864,912, filed on Sep. 25, 2015, now pending. The prior application Ser. No. 14/864,912 claims the priority benefit of Taiwan application serial no. 104121918, filed on Jul. 6, 2015. The entirety of each of the above-mentioned patent applications is hereby incorporated by reference herein and made a part of this specification.

BACKGROUND OF THE INVENTION

Field of the Invention

The invention relates to an integrated circuit, and particularly relates to a semiconductor device.

Description of Related Art

Image sensor is equipment used for converting optical images into electrical signals, and is widely applied to digital cameras and other electronic optical equipment. The early image sensor adopts an analog signal, for example a video camera tube. Today, the image sensors are mainly divided into two types of image sensors including a charge-coupled device (CCD) type and a complementary metal oxide semiconductor (CMOS) type.

The CMOS type image sensor is a device adopting a CMOS manufacturing technique to convert optical images into electrical signals. Compared with the CCD type image sensor, in the CMOS type image sensor, a signal processing circuit can be fabricated into a single chip, by which not only a product volume is reduced, it is also compatible to the CMOS technique. Therefore, the CMOS type image sensor has advantages of low manufacturing cost and low power consumption.

Generally, a light pipe structure is formed on a photo sensor to increase light sensitivity of the CMOS type image sensor. However, the light above an area outside the light pipe structure (i.e., a scattered light) is probably transmitted to the photo sensor under the light pipe structure, which may cause a cross-talk phenomenon, such that the noise received by the CMOS type image sensor is increased, and an image resolution is decreased.

SUMMARY OF THE INVENTION

The invention is directed to a semiconductor device having a shielding layer surrounding a light pipe structure, by which light above an area outside the light pipe structure is shielded to avoid decreasing an image resolution due to light scattering.

The invention provides a semiconductor device including a substrate, at least one sensor, a dielectric layer, at least one light pipe structure, at least one pad, a shielding layer, and a protection layer. The substrate has a first region and a second region. The sensor is located in the substrate of the first region. The dielectric layer is located on the substrate of the first region and the second region. The light pipe structure is located in the dielectric layer of the first region. The light pipe structure corresponds to the sensor. The pad is located in the dielectric layer of the second region. The shielding layer is located on the dielectric layer, wherein the shielding layer surrounds the light pipe structure. The protection layer is located on the shielding layer. At least one pad opening is disposed in the dielectric layer, the shielding layer and the protection layer above the pad. The pad opening exposes a top surface of the corresponding pad.

According to the above descriptions, in the invention, the shielding layer surrounds the light pipe structure for shielding the light above an area outside the light pipe structure (i.e., the scattered light). Therefore, the cross-talk phenomenon is effectively mitigated to decrease the noise received by the CMOS type image sensor, so as to improve an image resolution. Moreover, by using the shielding layer to surround the pad opening, a problem of delamination of the protection layer caused by a heat treatment process is resolved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1F are cross-sectional views of a method for manufacturing a semiconductor device according to a first embodiment of the invention.

Figure 1A:
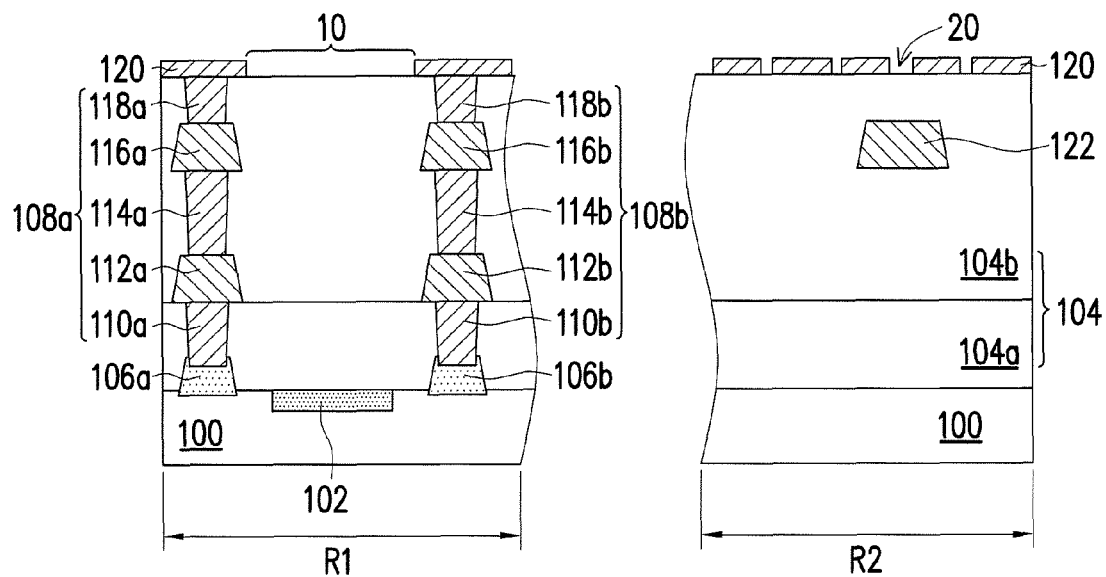
FIGS. 1A to 1F are cross-sectional views of a method for manufacturing a semiconductor device according to a first embodiment of the invention.
Figure 1B:
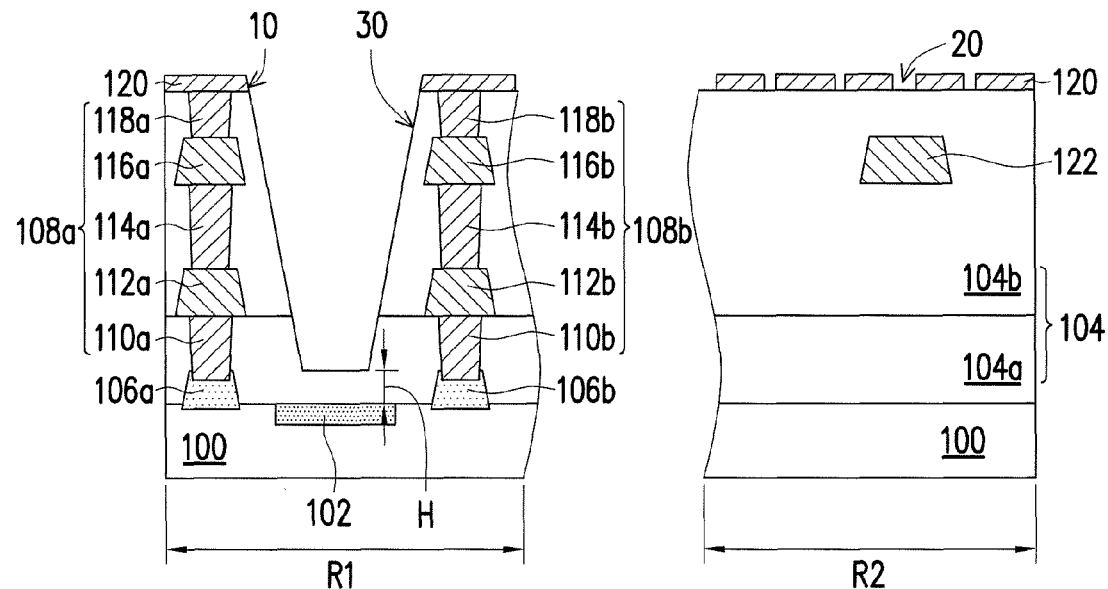
Figure 1C:
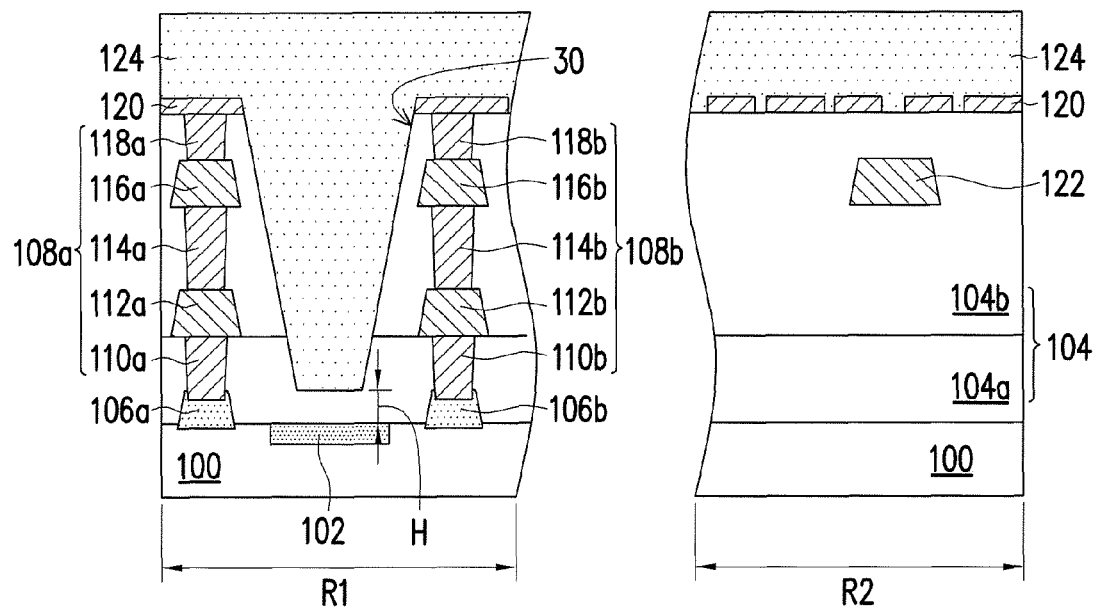
Figure 1D:
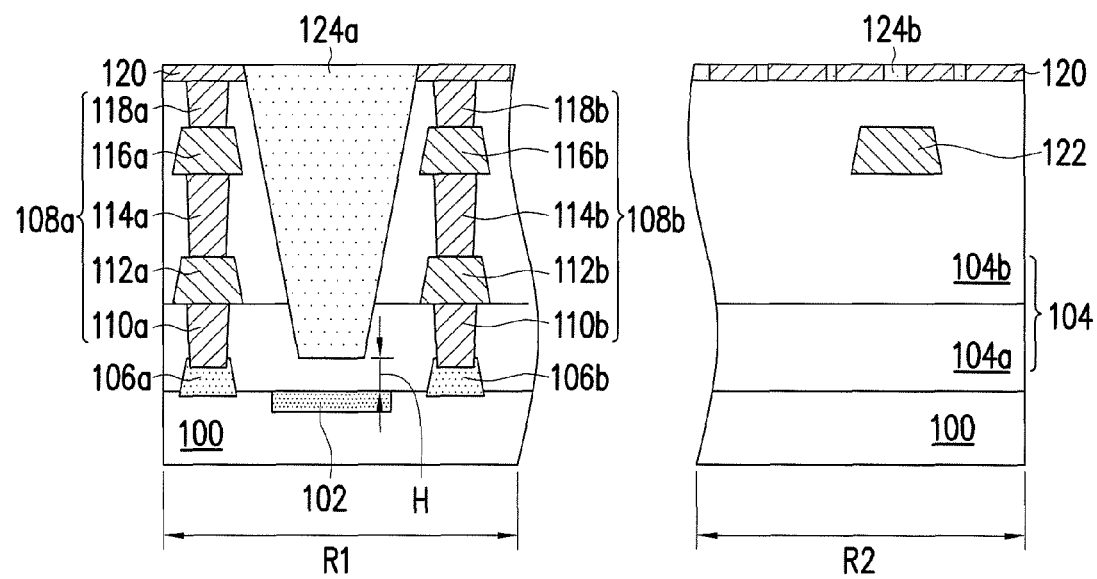
Figure 1E:
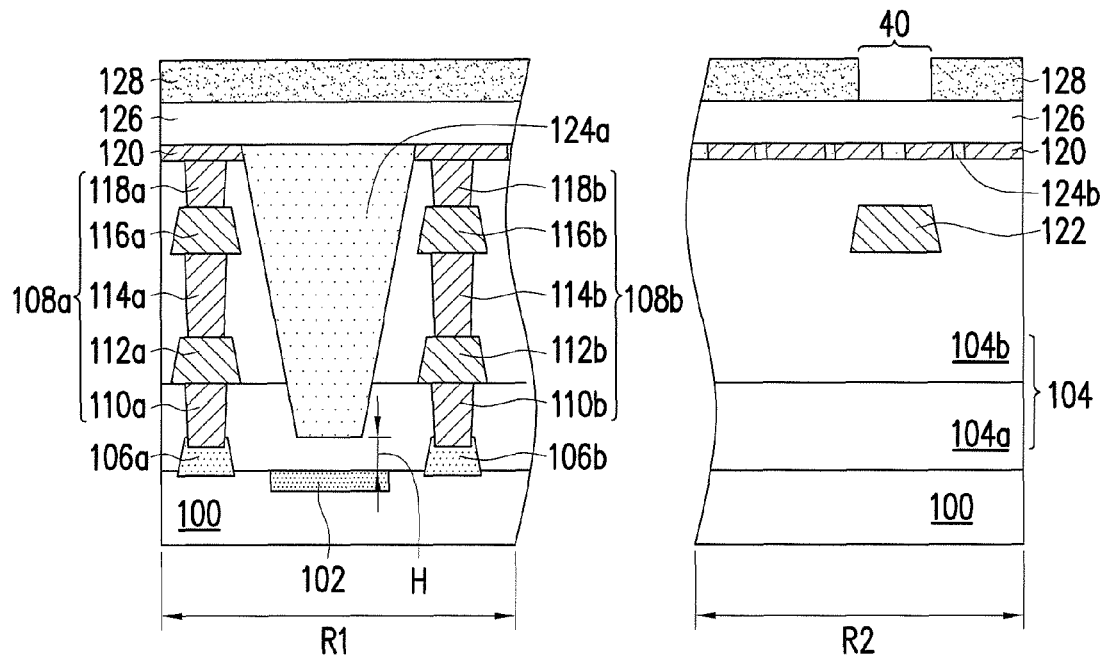
Figure 1F:
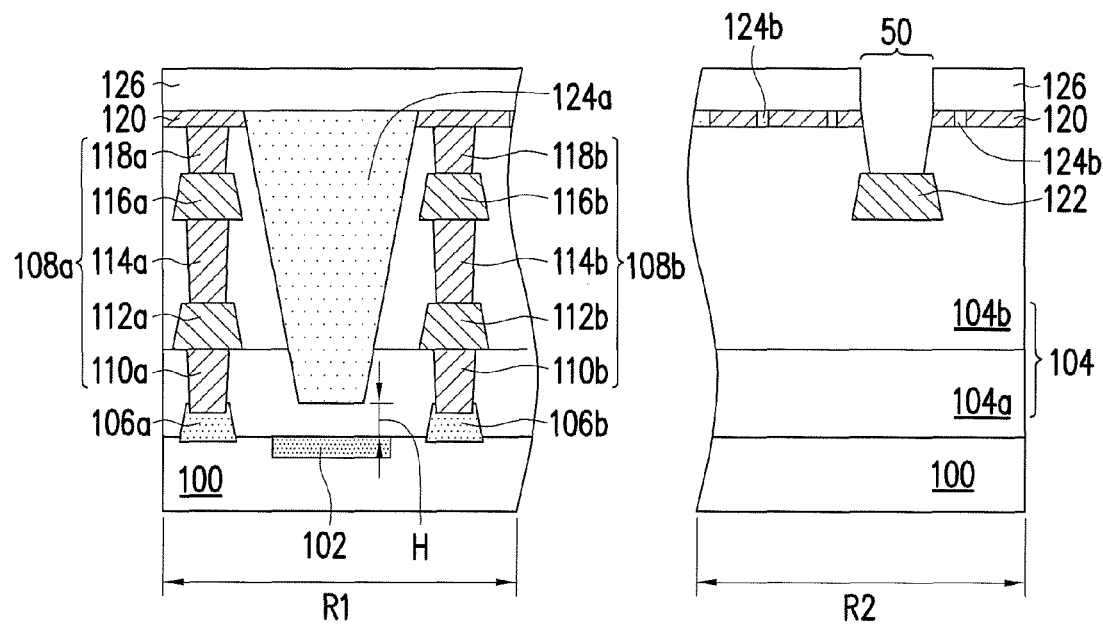

Referring to FIG. 1F, the present embodiment provides a semiconductor device 1 including a substrate 100, at least one sensor 102, a dielectric layer 104, at least one light pipe structure 124a, at least one pad 122, a shielding layer 120, and a protection layer 126. The substrate 100 has a first region R1 and a second region R2. The sensor 102 is located in the substrate 100 of the first region R1. The dielectric layer 104 is located on the substrate 100 of the first region R1 and the second region R2. The light pipe structure 124a is located in the dielectric layer 104 of the first region R1. The light pipe structure 124a corresponds to the sensor 102. The pad 122 is located in the dielectric layer 104 of the second region R2. The shielding layer 120 is located on the dielectric layer 104. The shielding layer 120 is disposed at a periphery of the light pipe structure 124a and surrounds the light pipe structure 124a. The protection layer 126 is located on the shielding layer 120. At least one pad opening 50 is disposed in the dielectric layer 104b, the shielding layer 120 and the protection layer 126 above the pad 122. The pad opening 50 exposes a top surface of the corresponding pad 122. The shielding layer 120 is disposed at the periphery of the pad opening 50 and surrounds the pad opening 50.

It should be noticed that the light pipe structure 124a can be configured to filter light above the light pipe structure 124a, and only the light with a specific wavelengths can pass through the light pipe structure 124a to reach a surface of the sensor 102. The shielding layer 120 is disposed at the periphery of the light pipe structure 124a to surround the light pipe structure 124a, which can block the light above an area outside the light pipe structure 124a (i.e., a scattered light). Therefore, in the present embodiment, a cross-talk phenomenon is effectively mitigated to decrease the noise received by the sensor 102 under the light pipe structure 124a, so as to improve an image resolution.

Moreover, in the present embodiment, the shielding layer 120 is disposed at the periphery of the pad opening 50 to surround the pad opening 50, so that the shielding layer 120 at the periphery of the pad opening 50 is disposed between the protection layer 126 and the dielectric layer 104b. Compared with a light filter material layer 124b, since thermal expansion coefficients of the shielding layer 120 and the protection layer 126 are relatively close, during an etching process or a subsequent heat treatment process for forming the pad opening 50, the present embodiment is not liable to have a problem of delamination of the protection layer 126.

A method for manufacturing the semiconductor device 1 of the above embodiment is introduced below, and steps thereof are as follows.

Referring to FIG. 1A, the substrate 100 is provided, wherein the substrate 100 has the first region R1 and the second region R2. The substrate 100 is, for example, a semiconductor substrate of a first conductive type, for example, a P-type substrate. A material of the semiconductor substrate is, for example, at least one material selected from a group consisting of Si, Ge, SiGe, GaP, GaAs, SiC, SiGeC, InAs and InP. In an embodiment, the first region R1 can be a pixel array region, and the second region R2 can be a periphery region.

Then, the sensor 102 is formed in the substrate 100 of the first region R1. In an embodiment, the sensor 102 is, for example, a photodiode, a metal oxide semiconductor field effect transistor (MOSFET) or a combination thereof.

Thereafter, the dielectric layer 104 is formed on the substrate 100 of the first region R1 and the second region R2. A material of the dielectric layer 104 is, for example, silicon oxide, boro-phospho-silicate glass (BPSG) or a combination thereof, and a method for forming the dielectric layer 104 is, for example, a chemical vapor deposition method.

Then, gates 106a and 106b and metal interconnects 108a and 108b are sequentially formed in the dielectric layer 104 of the first region R1. The sensor 102 is located in the substrate 100 between the gates 106a and 106b. To be specific, a method for forming the gates 106a and 106b and the metal interconnects 108a and 108b is as follows. First, the gates 106a and 106b are formed on the substrate 100 of the first region R1. Then, a dielectric layer 104a is formed to cover the gates 106a and 106b and the surface of the sensor 102. Then, two contact openings are formed in the dielectric layer 104a of the first region R1, and the contact openings respectively expose surfaces (not shown) of the gates 106a and 106b. Thereafter, a conductive material is filled into the contact openings to form contact plugs 110a and 110b. Then, patterned conductive layers 112a and 112b are formed on the dielectric layer 104a. The patterned conductive layer 112a is electrically connected to the contact plug 110a, and the patterned conductive layer 112b is electrically connected to the contact plug 110b. Then, the dielectric layer 104b is formed to cover the patterned conductive layers 112a and 112b and a surface of the dielectric layer 104a. Thereafter, according to the aforementioned methods for forming the contact plugs 110a and 110b and the patterned conductive layers 112a and 112b, contact plugs 114a and 114b, patterned conductive layers 116a and 116b and contact plugs 118a and 118b are sequentially formed.

In an embodiment, the gates 106a and 106b are, for example, transfer gates. In an embodiment, a material of the gates 106a and 106b is, for example, doped polysilicon, undoped polysilicon or a combination thereof, and a method for forming the same is, for example, the chemical vapor deposition method. In an embodiment, a material of the metal interconnects 108a and 108b is, for example, Ti, TiN, TaN, W, TiW, Al, Cu or a combination thereof. A material of the contact plugs 110a, 110b, 114a, 114b, 118a and 118b and a material of the patterned conductive layers 112, 112b, 116a and 116b can be the same or different. A method for forming the metal interconnects 108a and 108b is, for example, a physical vapor deposition method or the chemical vapor deposition method.

Then, the pad 122 is formed in the dielectric layer 104 of the second region R2. A method for forming the pad 122 is similar to the method for forming the patterned conductive layers 116a and 116b, which is not repeated. In an embodiment, the pad 122 and the patterned conductive layers 116a and 116b can be simultaneously formed, though the invention is not limited thereto, and in other embodiments, the pad 122 can be first formed, and then the patterned conductive layers 116a and 116b are formed, or the patterned conductive layers 116a and 116b are first formed, and then the pad 122 is formed. In an embodiment, a material of the pad 122 is, for example, W, Al, Cu or a combination thereof, and a method for forming the pad 122 is, for example, the physical vapor deposition method or the chemical vapor deposition method.

Thereafter, the shielding layer 120 is formed on the dielectric layer 104. The shielding layer 120 has an opening 10 and a plurality of openings 20. The opening 10 is located between the metal interconnects 108a and 108b and corresponds to the sensor 102. The openings 20 are located on the dielectric layer 104 of the region R2. In an embodiment, a material of the shielding layer 120 includes metal, and the metal is, for example, W, Al, Cu or a combination thereof, and a method for forming the shielding layer 120 is, for example, the physical vapor deposition method or the chemical vapor deposition method. In an embodiment, a thickness of the shielding layer 120 is, for example, 1 nm to 1,000 nm.

Referring to FIG. 1B, the shielding layer 120 is taken as a mask to remove a part of the dielectric layer 104 to form a light pipe opening 30. In FIG. 1B, although a part of the dielectric layer 104a is located between a bottom surface of the light pipe opening 30 and a surface of the substrate 100, the invention is not limited thereto. In other embodiments, the light pipe opening 30 can expose the surface of the substrate 100 (i.e., the surface of the sensor 102). In an embodiment, a method for removing the part of the dielectric layer 104 is, for example, a dry etching method. The dry etching method is, for example, a reactive ion etching (RIE) method. In an embodiment, a height H between the bottom surface of the light pipe opening 30 and the surface of the substrate 100 is, for example, 1 nm to 10,000 nm.

Referring to FIG. 1C, a light filter material layer 124 is formed on the dielectric layer 104. The light filter material layer 124 is filled into the opening 10, the openings 20 and the light pipe opening 30 and covers a surface of the shielding layer 120. In an embodiment, a material of the light filter material layer 124 is, for example, polymer. In an embodiment, a refractive index of the material of the light filter material layer 124 is different to a refractive index of the dielectric layer 104. A method for forming the light filter material layer 124 is, for example, a spin on coating method or the chemical vapor deposition method.

Referring to FIG. 1D, a part of the light filter material layer 124 is removed to expose the surface of the shielding layer 120. Now, the light filter material layer 124a filled in the opening 10 and the light pipe opening 30 can be regarded as the light pipe structure 124a. As shown in FIG. 1D, the shielding layer 120 is disposed at the periphery of the light pipe structure 124a and surrounds the light pipe structure 124a, and is configured to block the light above an area outside the light pipe structure 124a (i.e., the scattered light). Therefore, in the present embodiment, the cross-talk phenomenon is effectively mitigated to decrease the noise received by the sensor 102 under the light pipe structure 124a, so as to improve the image resolution. In an embodiment, a top surface of the light pipe structure 124a and a top surface of the shielding layer 120 are substantially coplanar. In other embodiments, the top surface of the light pipe structure 124a and the top surface of the shielding layer 120 may have a tiny height difference during an actual manufacturing process. In an embodiment, a method for removing the part of the light filter material layer 124 is, for example, a chemical mechanical polishing (CMP) method.

Referring to FIG. 1E, the protection layer 126 and a mask layer 128 are sequentially formed on the shielding layer 120. The mask layer 128 has an opening 40. The opening 40 corresponds to the pad 122 located thereunder. In an embodiment, a material of the protection layer 126 includes a low temperature material layer. The low temperature material layer is, for example, SiN, SiO, TaO or a combination thereof. A method for forming the protection layer 126 is, for example, the chemical vapor deposition method. In an embodiment, a material of the mask layer 128 is, for example, photoresist, nitride or a combination thereof, and a method for forming the mask layer 128 is, for example, the chemical vapor deposition method.

Referring to FIGS. 1E and 1F, the mask layer 128 is taken as a mask to remove a part of the protection layer 126, a part of the shielding layer 120 and a part of the dielectric layer 104 to form the pad opening 50. The pad opening 50 exposes a top surface of the pad 122. Then, the mask layer 128 is removed. According to FIG. 1F, it is known that the shielding layer 120 is disposed at the periphery of the pad opening 50 and surrounds the pad opening 50. Moreover, the shielding layer 120 located at the periphery of the pad opening 50 is also disposed between the protection layer 126 and the dielectric layer 104b. Compared with the light filter material layer 124b, since thermal expansion coefficients of the shielding layer 120 and the protection layer 126 are relatively close, during an etching process or a subsequent heat treatment process for forming the pad opening 50, the present embodiment is not liable to have a problem of delamination of the protection layer 126. In an embodiment, a method for removing the part of the protection layer 126, the part of the shielding layer 120 and the part of the dielectric layer 104 is, for example, the dry etching method. The dry etching method is, for example, a reactive ion etching (RIE) method.

Figure 2:
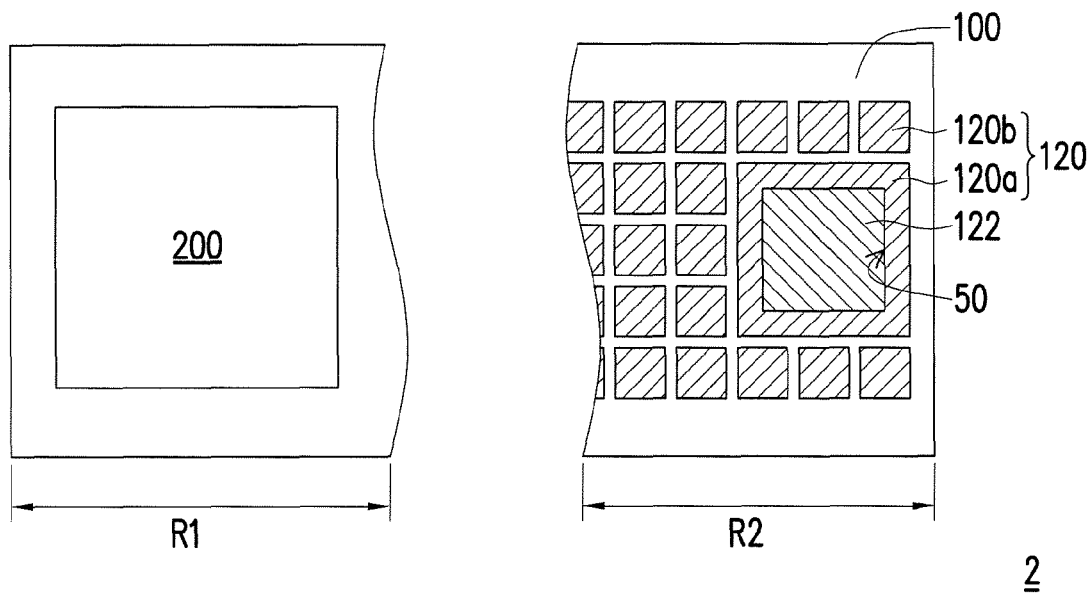
FIG. 2 is a top view of a semiconductor device according to a second embodiment of the invention.

FIG. 2 is a top view of a semiconductor device according to a second embodiment of the invention.

Referring to FIG. 1F and FIG. 2, in an embodiment, FIG. 2 can be regarded as a top view of the semiconductor device of FIG. 1F. For clarity's sake, only the substrate 100, the pad 122, the shielding layer 120 and a pixel array region 200 are illustrated in FIG. 2. Coupling relations of the other components may refer to the aforementioned paragraphs, and details thereof are not repeated. The semiconductor device 2 of the present embodiment includes the substrate 100, the pad 122, the shielding layer 120 and the pixel array region 200. The substrate 100 has the first region R1 and the second region R2. The pixel array region 200 is located on the substrate 100 of the first region R1. The pad 122 is located on the substrate 100 of the second region R2. The shielding layer 120 has the pad opening 50, and the pad opening 50 exposes the top surface of the corresponding pad 122. To be specific, the shielding layer 120 includes a first portion 120a and a second portion 120b. In an embodiment, the first portion 120a is, for example, an annular structure, which surrounds the pad opening 50. The second portion 120b for example, includes a plurality of rectangular structures arranged in an array. The rectangular structures surround the first portion 120a. However, the invention is not limited thereto, and in other embodiments, the second portion 120b, for example, includes a plurality of round structures, polygonal structures or a combination thereof. In an embodiment, the first portion 120a and the second portion 120b are not contacted to each other. Namely, the first portion 120a and the second portion 120b are spaced from each other. Moreover, in some embodiments, the pad 122 is, for example, one or a plurality of pads 122. The pad opening 50 is, for example, one or a plurality of pad openings 50. The first portion 120a is, for example, one or a plurality of first portions 120a. The second portion 120b is, for example, one or a plurality of second portions 120b.

Figure 3:
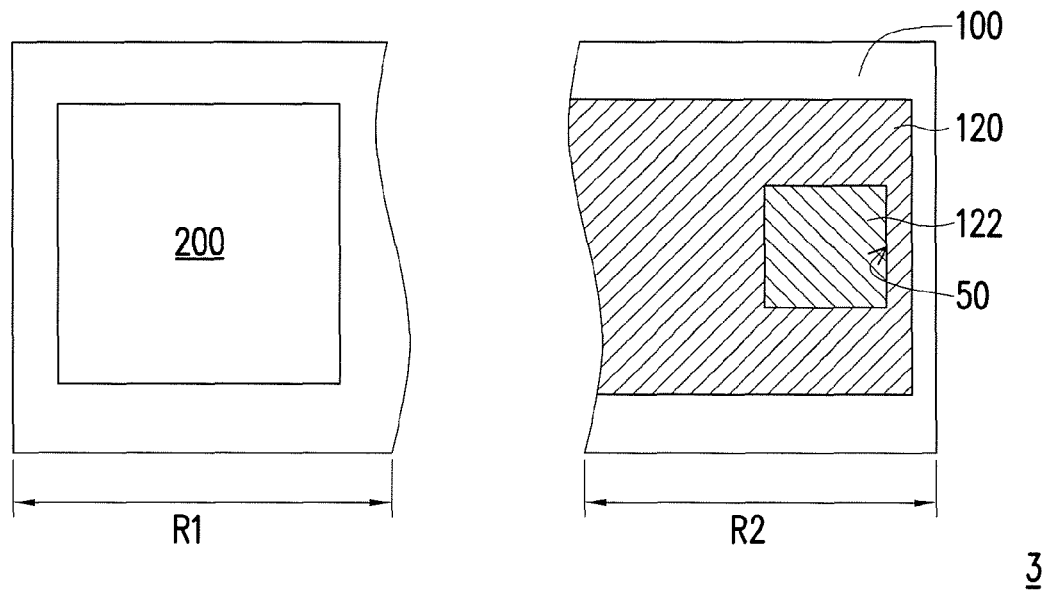
FIG. 3 is a top view of a semiconductor device according to a third embodiment of the invention.

FIG. 3 is a top view of a semiconductor device according to a third embodiment of the invention.

Referring to FIG. 3, FIG. 3 is similar to FIG. 2, and a difference therebetween is that the first portion and the second portion of the shielding layer 120 of FIG. 3 are contacted to each other to form an integral shielding layer 120. The shielding layer 120 of FIG. 3 is also disposed at the periphery of the pad opening 50 and surrounds the pad opening 50, so as to resolve the problem of delamination of the protection layer.

In summary, in the invention, the shielding layer surrounds the light pipe structure for shielding the light above an area outside the light pipe structure (i.e., the scattered light). Therefore, the cross-talk phenomenon is effectively mitigated to decrease the noise received by the CMOS type image sensor, so as to improve an image resolution. Moreover, by using the shielding layer to surround the pad opening, the problem of delamination of the protection layer caused by a heat treatment process is resolved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A semiconductor device, comprising:
  a substrate, having a first region and a second region;
  at least one sensor, located in the substrate of the first region;
  a dielectric layer, located on the substrate of the first region and the second region;
  at least one light pipe structure, located in the dielectric layer of the first region, wherein the light pipe structure corresponds to the sensor;
  at least one pad, located in the dielectric layer of the second region;
  a shielding layer, located on the dielectric layer, wherein the shielding layer surrounds the light pipe structure; and a protection layer, located on the shielding layer, wherein at least one pad opening is disposed in the dielectric layer, the shielding layer and the protection layer above the pad for exposing a top surface of the corresponding pad.

2. The semiconductor device as claimed in claim 1, wherein the shielding layer surrounds the pad opening.

3. The semiconductor device as claimed in claim 1, wherein a top surface of the light pipe structure and a top surface of the shielding layer are substantially coplanar.

4. The semiconductor device as claimed in claim 1, wherein a material of the light pipe structure comprises a light filter material, wherein a refractive index of the light filter material is different to a refractive index of the dielectric layer.

5. The semiconductor device as claimed in claim 4, wherein the light filter material comprises polymer.

6. The semiconductor device as claimed in claim 1, wherein a material of the shielding layer comprises a metal, and the metal comprises W, Al, Cu or a combination thereof.

7. The semiconductor device as claimed in claim 1, wherein a material of the protection layer comprises a low temperature material layer, and the low temperature material layer comprises SiN, SiO, TaO or a combination thereof.

8. The semiconductor device as claimed in claim 1, wherein the first region is a pixel array region, and the second region is a periphery region.

9. The semiconductor device as claimed in claim 1, wherein the shielding layer has a first portion and a second portion, the first portion surrounds the pad opening, and the second portion surrounds the first portion.

10. The semiconductor device as claimed in claim 9, wherein the first portion and the second portion are contacted to each other.

11. The semiconductor device as claimed in claim 9, wherein the first portion and the second portion are spaced from each other.

* * * * *